United States Patent
Sekiya

(10) Patent No.: US 11,056,374 B2
(45) Date of Patent: Jul. 6, 2021

(54) PROTECTIVE MEMBER FORMING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/666,656

(22) Filed: Oct. 29, 2019

(65) Prior Publication Data
US 2020/0135531 A1   Apr. 30, 2020

(30) Foreign Application Priority Data

Oct. 30, 2018 (JP) .............................. JP2018-204116

(51) Int. Cl.
| | | |
|---|---|---|
| H01L 21/683 | (2006.01) | |
| H01L 21/56 | (2006.01) | |
| H01L 21/67 | (2006.01) | |

(52) U.S. Cl.
CPC ........ *H01L 21/6835* (2013.01); *H01L 21/561* (2013.01); *H01L 21/6715* (2013.01); *H01L 2221/68327* (2013.01)

(58) Field of Classification Search
None
See application file for complete search history.

(56) References Cited

U.S. PATENT DOCUMENTS

| | | | |
|---|---|---|---|
| 6,682,990 B1 * | 1/2004 | Iwane | H01L 31/0504 438/458 |
| 7,918,714 B2 * | 4/2011 | Kroeninger | B24B 41/068 451/41 |
| 2018/0295717 A1 * | 10/2018 | Yu | H01L 23/49822 |

FOREIGN PATENT DOCUMENTS

JP          2010155297 A       7/2010

* cited by examiner

*Primary Examiner* — Michelle Mandala
(74) *Attorney, Agent, or Firm* — Greer, Burns & Crain, Ltd.

(57) ABSTRACT

A protective member forming method includes forming a water film on a flat holding surface of a support base, placing a wafer on the water film formed on the holding surface and next freezing the water film in a condition where the wafer floats on an upper surface of the water film owing to the surface tension of the water film, thereby forming an ice layer and fixing the wafer on the ice layer, supplying a liquid resin curable by the application of ultraviolet light to the upper surface of the wafer, opposing a transparent sheet to the wafer with the liquid resin interposed therebetween, and applying ultraviolet light to the liquid resin, thereby curing the liquid resin to form a protective member on a whole of the upper surface of the wafer.

6 Claims, 6 Drawing Sheets

PROTECTIVE MEMBER FORMING METHOD

BACKGROUND OF THE INVENTION

Field of the Invention

The present invention relates to a protective member forming method.

Description of the Related Art

In many cases, a semiconductor wafer such as a silicon wafer is obtained by slicing an ingot with a wire saw or the like. The wafer (as-sliced wafer) obtained by performing such a slicing step has variations in thickness, that is, has an undulation. Usually, such variations in thickness within the wafer must be minimized, so as to form fine devices on the wafer. That is, it is necessary to form a wafer as a substrate having a uniform thickness and a flat surface. To remove the undulation of the wafer, both the front side and the back side of the wafer are ground and polished. However, when both the front side and the back side of the wafer having an undulation are ground and polished as applying a pressure to both sides, the variations in thickness of the wafer can be reduced, but the undulation cannot be removed. To cope with this problem, there has been developed a technique including the steps of applying a liquid resin to the front side (first surface) of the wafer in the condition where the undulation is maintained, next curing the liquid resin to thereby form a protective member on the front side of the wafer, and next grinding the back side (second surface) of the wafer with the front side of the wafer fixed by the protective member (see Japanese Patent No. 5320058, for example).

SUMMARY OF THE INVENTION

However, in the above related art, the protective member is formed by pressing the wafer against the viscous liquid resin to thereby spread the liquid resin on the whole of the first surface of the wafer. Accordingly, although a pressure applied to the wafer is removed after spreading the liquid resin on the whole of the first surface of the wafer, internal stress is left in the wafer due to the viscosity of the liquid resin, so that there is a possibility that the initial shape of the wafer in a natural condition (in the condition just after performing the slicing step) may be changed.

It is therefore an object of the present invention to provide a protective member forming method which can form a protective member capable of fixing a wafer in the condition where the shape of the wafer in its natural condition is maintained.

In accordance with an aspect of the present invention, there is provided a protective member forming method including a water film forming step of forming a water film on a flat holding surface of a support base; a wafer fixing step of placing a wafer having a first surface and a second surface on the water film formed on the holding surface in a condition where the first surface of the wafer is exposed and the second surface of the wafer is in contact with an upper surface of the water film, and next freezing the water film in the condition where the wafer floats on the upper surface of the water film owing to surface tension of the water film, thereby forming an ice layer and fixing the wafer on the ice layer; a liquid resin supplying step of supplying a liquid resin curable by an external stimulus to the first surface of the wafer, after performing the wafer fixing step, in such an amount that when the liquid resin is pressed on the first surface of the wafer, the liquid resin is spread on a whole of the first surface; a liquid resin pressing step of opposing a flat pressure surface to the wafer with the liquid resin interposed therebetween, the flat pressure surface being parallel to the holding surface, after performing the liquid resin supplying step, and next pressing the liquid resin to entirely spread the liquid resin on the first surface of the wafer; a liquid resin curing step of applying the external stimulus to the liquid resin after performing the liquid resin pressing step, thereby curing the liquid resin to form a protective member on the whole of the first surface of the wafer; and a wafer separating step of heating the ice layer to thereby melt the ice layer and next separate the wafer from the ice layer.

With this configuration, the wafer is placed on a water film, and the water film is frozen to form an ice layer, thereby fixing the wafer on the ice layer. Accordingly, the wafer can be fixed as keeping the shape in the natural condition. The shape in the natural condition of the wafer is a shape in the condition where no external force except gravity is applied to the wafer. Further, since the wafer is fixed on the ice layer, the protective member can be easily formed on the first surface of the wafer.

Preferably, the holding surface of the support base is coated with a water-repellent material.

According to the present invention, the water film is frozen in the condition where the wafer is placed on the water film, thereby fixing the wafer on the ice layer changed from the water film. Accordingly, the wafer can be fixed as keeping the shape in the natural condition.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
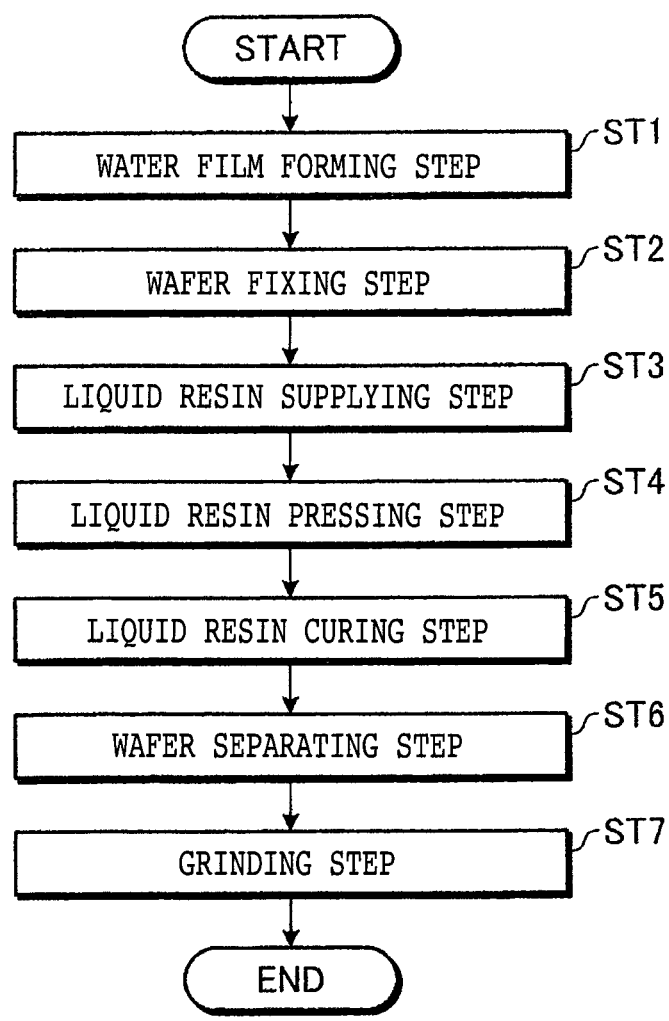
FIG. 1 is a flowchart depicting a procedure of a protective member forming method according to a preferred embodiment of the present invention.
Figure 2:
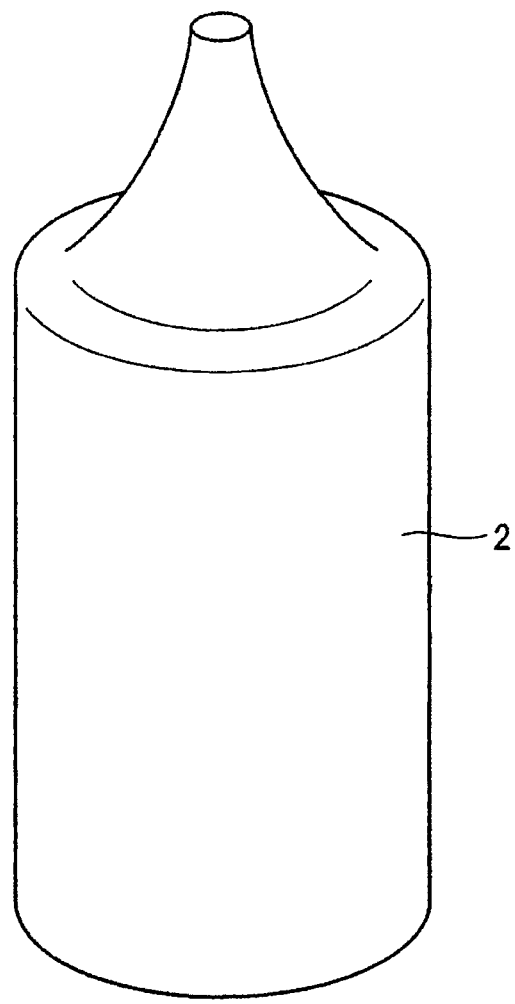
FIG. 2 is a schematic perspective view depicting a wafer to which the protective member forming method according to this preferred embodiment is applicable.
Figure 2:
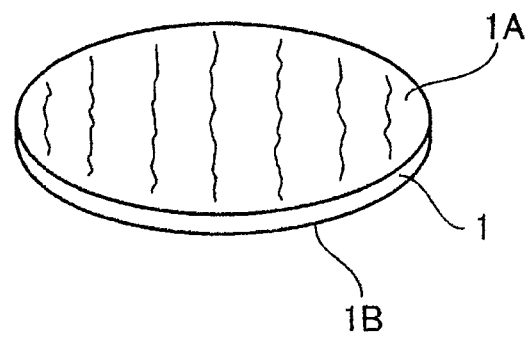

FIG. 1 is a flowchart depicting a procedure of a protective member forming method according to a preferred embodiment of the present invention. FIG. 2 is a schematic perspective view depicting a wafer 1 to which the protective member forming method according to this preferred embodiment is applicable. As depicted in FIG. 2, the wafer 1 is an as-sliced wafer in the condition before forming a device pattern. For example, the wafer 1 may be obtained by slicing a solid cylindrical ingot 2 formed of a semiconductor such as silicon (Si), gallium arsenide (GaAs), and silicon carbide (SiC). The ingot 2 may be sliced by using a wire saw (not depicted) to obtain a plurality of disk-shaped wafers (slicing step). As depicted in FIG. 2, the wafer 1 has a first surface 1A (upper surface as viewed in FIG. 2) and a second surface 1B (lower surface as viewed in FIG. 2). At least the first surface 1A of the wafer 1 includes a distorsion element such as undulation and warpage caused by the wire saw in slicing the ingot 2. To remove the undulation and warpage, a resin is applied to the first surface 1A of the wafer 1 to form a protective member on the first surface 1A. Thereafter, the second surface 1B of the wafer 1 is first ground to be flattened, and the first surface 1A of the wafer 1 is next ground to be flattened. As depicted in FIG. 1, the protective member forming method according to this preferred embodiment includes a water film forming step ST1, wafer fixing step ST2, liquid resin supplying step ST3, liquid resin pressing step ST4, liquid resin curing step ST5, wafer separating step ST6, and grinding step ST7. These steps ST1 to ST7 will now be described.

[Water Film Forming Step ST1]

Figure 3:
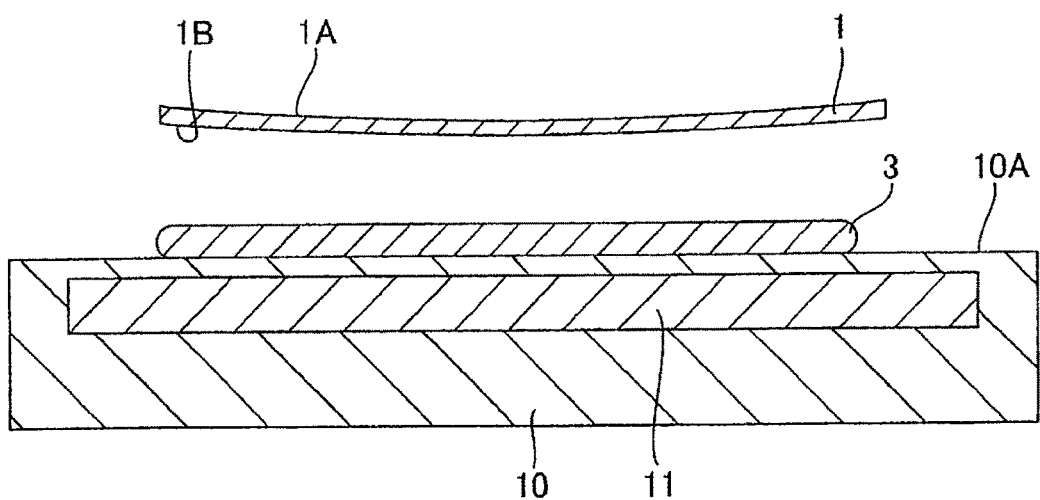
FIG. 3 is a schematic sectional view for illustrating a water film forming step.

FIG. 3 is a schematic sectional view depicting the water film forming step ST1. In the water film forming step ST1, a support base 10 having a flat holding surface 10A is prepared, and a water film 3 for holding the wafer 1 is formed on the holding surface 10A of the support base 10. The support base 10 is formed of metal having high thermal conductivity. The holding surface 10A of the support base 10 is coated with a water-repellent material such as fluororesin.

A heat source portion 11 for cooling and heating the support base 10 is provided inside the support base 10. The heat source portion 11 functions to cool the water film 3 formed on the holding surface 10A through the support base 10, thereby forming an ice layer and also functions to heat the ice layer to restore the water film 3. For example, the heat source portion 11 may be realized by a Peltier element for cooling the support base 10 and an electric heater for heating the support base 10. As another example, a heat exchanger connected to a heat pump unit may be used to cool or heat the support base 10.

A water dropping nozzle (not depicted) is provided above the holding surface 10A of the support base 10 to drop water (pure water) onto the holding surface 10A, thereby forming the water film 3 on the holding surface 10A. Since the holding surface 10A is coated with a water-repellent material, the water dropped onto the holding surface 10A becomes the water film 3 having a circular shape due to surface tension. The amount of water to be dropped is adjusted so that the wafer 1 can be entirely supported on the water film 3.

The wafer 1 depicted in FIG. 3 is an as-sliced wafer as described above, and the wafer 1 is curved so that the second surface 1B (lower surface as viewed in FIG. 3) of the wafer 1 is projecting downward. This curved shape of the wafer 1 is a shape in the condition where no external force except gravity is applied to the wafer 1. That is, this curved shape of the wafer 1 is a shape in a natural condition just after slicing the ingot 2.

[Wafer Fixing Step ST2]

Figure 4:
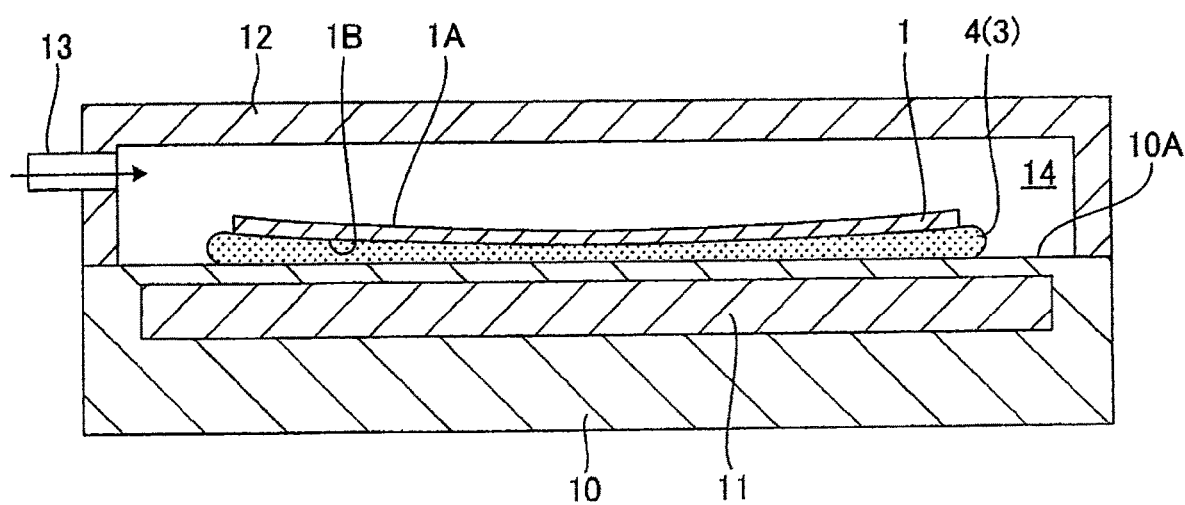
FIG. 4 is a schematic sectional view for illustrating a wafer fixing step.

FIG. 4 is a schematic sectional view depicting the wafer fixing step ST2. In the wafer fixing step ST2, the second surface 1B of the wafer 1 is placed on the water film 3 formed on the holding surface 10A. In this case, the wafer 1 floats on the upper surface of the water film 3 as keeping the curved shape in the natural condition mentioned above, owing to the surface tension of the water film 3.

Thereafter, the water film 3 is frozen in the condition where the wafer 1 floats on the upper surface of the water film 3, thereby fixing the wafer 1. More specifically, the heat source portion 11 is operated to cool the support base 10, thereby freezing the water film 3 formed on the holding surface 10A. Further, a cover member 12 is mounted on the holding surface 10A of the support base 10 so as to define an inside space 14, in which the wafer 1 and the water film 3 are enclosed. The cover member 12 is provided with a cool air inlet pipe 13 for introducing a cool air into the inside space 14 of the cover member 12. Accordingly, the cool air is introduced through the cool air inlet pipe 13 into the inside space 14, thereby promoting the freezing of the water film 3 formed on the holding surface 10A. In this manner, the water film 3 is frozen to form an ice layer 4, and the wafer 1 is fixed to the upper surface of the ice layer 4 as keeping the shape in the natural condition.

[Liquid Resin Supplying Step ST3]

Figure 5:
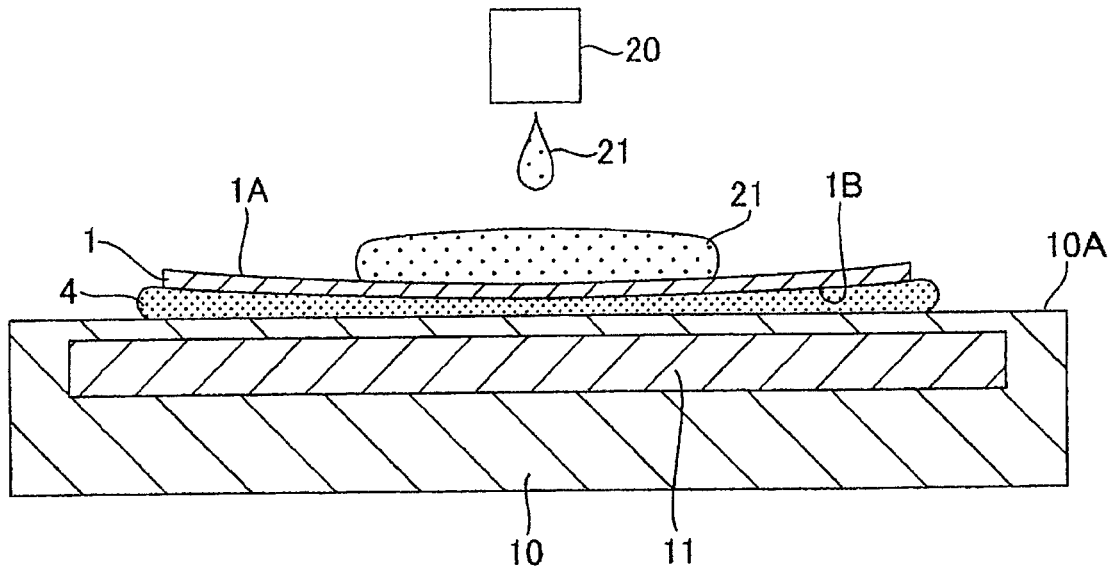
FIG. 5 is a schematic sectional view for illustrating a liquid resin supplying step.

FIG. 5 is a schematic sectional view depicting the liquid resin supplying step ST3. In the liquid resin supplying step ST3, a predetermined amount of liquid resin 21 is supplied (dropped) from a liquid resin nozzle 20 depicted in FIG. 5 to the upper surface (first surface) 1A of the wafer 1 at the center thereof. The liquid resin 21 is a material of forming a protective member for protecting the upper surface 1A of the wafer 1. The liquid resin 21 is a resin curable by an external stimulus (e.g., the application of ultraviolet light). The amount of the liquid resin 21 to be supplied is adjusted so that when the liquid resin 21 is pressed on the upper surface 1A of the wafer 1, the liquid resin 21 is entirely spread on the upper surface 1A.

[Liquid Resin Pressing Step ST4]

Figure 6:
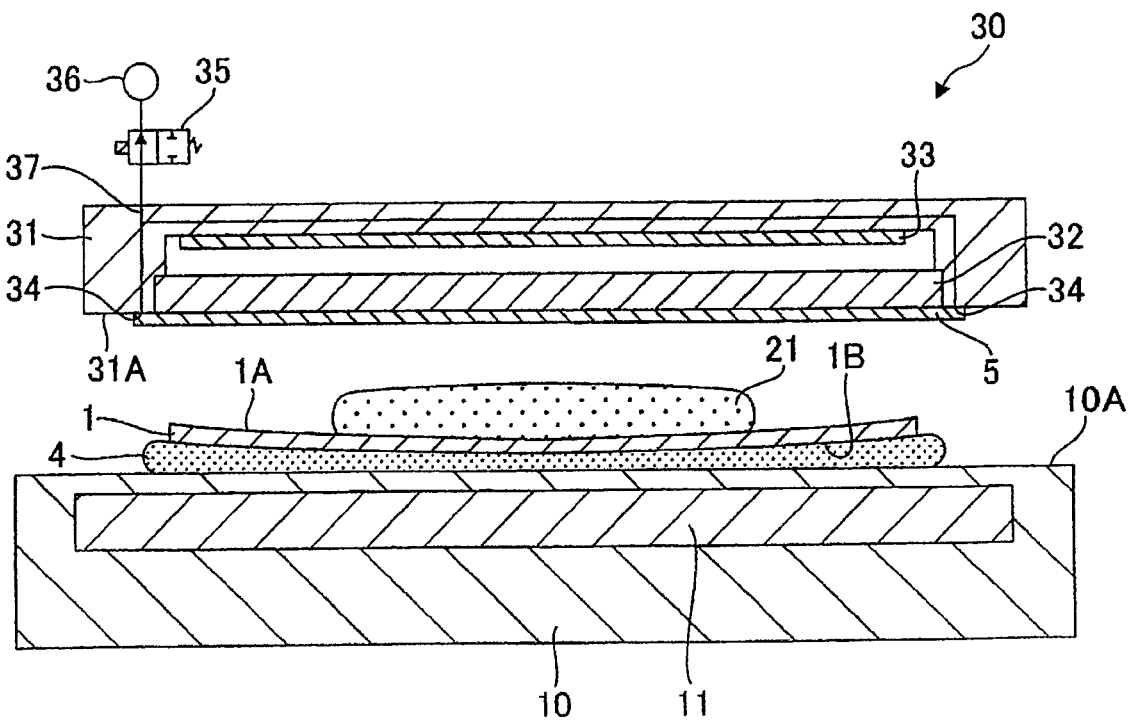
FIG. 6 is a schematic sectional view for illustrating a liquid resin pressing step.

FIG. 6 is a schematic sectional view depicting the liquid resin pressing step ST4. The liquid resin pressing step ST4 may be performed by using a resin pressing and curing unit 30 depicted in FIG. 6. The resin pressing and curing unit 30 includes a unit body 31 vertically movable relative to the support base 10, a transparent plate 32 provided at the lower portion of the unit body 31, and a plurality of ultraviolet light sources 33 provided inside the unit body 31. The transparent plate 32 has a flat lower surface, which is flush with the lower surface 31A of the unit body 31. The transparent plate 32 is formed of an ultraviolet light transmitting material (e.g., glass or resin).

A plurality of suction openings 34 are formed on the lower surface 31A of the unit body 31 so as to be arranged around the transparent plate 32. A suction passage 37 is formed inside the unit body 31 and connected to the plural suction openings 34. The suction passage 37 is connected through an electromagnetic valve 35 to a vacuum source 36. In this preferred embodiment, a transparent sheet 5 is held on the lower surface 31A of the unit body 31 by a suction force produced by the vacuum source 36. The transparent sheet 5 is held in parallel to the holding surface 10A of the support base 10 and opposed to the wafer 1 with the liquid resin 21 interposed therebetween. When the unit body 31 is lowered toward the support base 10, the transparent sheet 5 functions as a flat pressure surface for pressing the liquid resin 21 on the upper surface 1A of the wafer 1 to entirely spread the liquid resin 21 on the upper surface 1A. The transparent sheet 5 also functions to prevent the adherence of the liquid resin 21 to the transparent plate 32 and facilitate the handling of the wafer 1 coated with the liquid resin 21. The transparent sheet 5 is formed of a flexible material such as polyethylene terephthalate (PET) resin.

[Liquid Resin Curing Step ST5]

Figure 7:
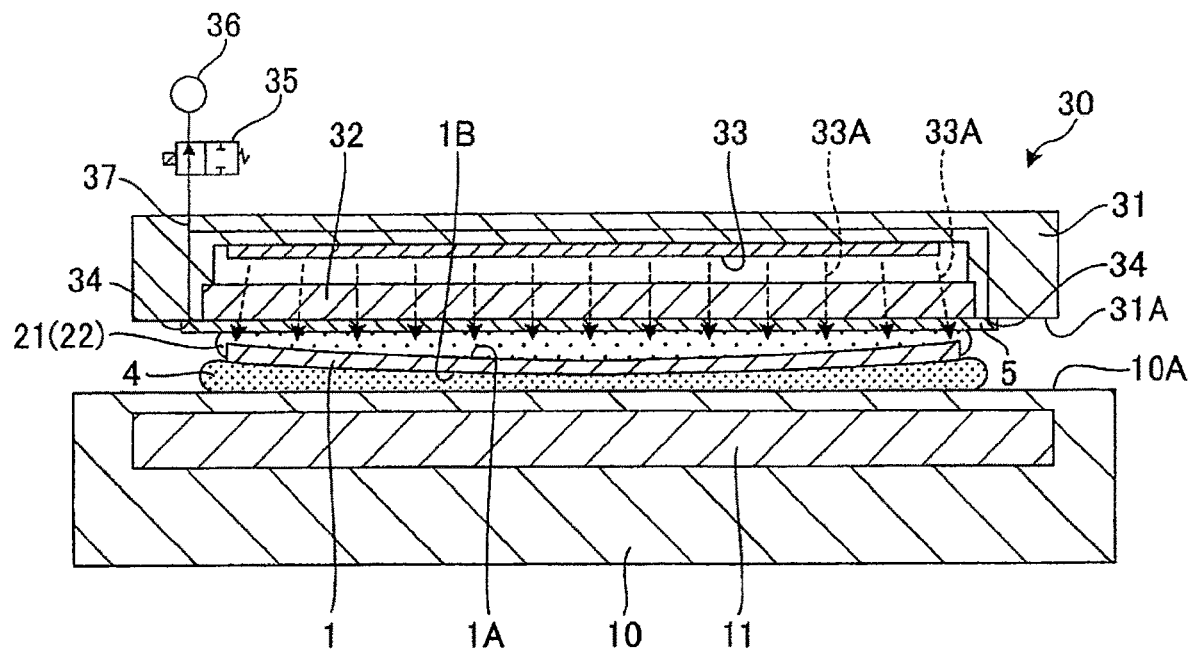
FIG. 7 is a schematic sectional view for illustrating a liquid resin curing step.

FIG. 7 is a schematic sectional view depicting the liquid resin curing step ST5. As depicted in FIG. 7, the unit body 31 is lowered toward the holding surface 10A of the support base 10 in the condition where the transparent sheet 5 is held under suction on the lower surface 31A of the unit body 31. Accordingly, the liquid resin 21 supplied to the upper surface 1A of the wafer 1 is pressed by the transparent sheet 5 and thereby entirely spread on the upper surface 1A of the wafer 1. As described above, the wafer 1 is fixed to the ice layer 4 formed on the holding surface 10A of the support base 10 as keeping the curved shape in the natural condition. Accordingly, even when a pressure is applied to the wafer 1 in spreading the liquid resin 21, there is no possibility that the original curved shape of the wafer 1 may be changed.

Thereafter, the ultraviolet light sources 33 provided inside the unit body 31 are turned on in the condition where the liquid resin 21 remains pressed by the unit body 31 as depicted in FIG. 7, thereby applying ultraviolet light 33A toward the liquid resin 21. As a result, the liquid resin 21 is cured by the stimulus of the ultraviolet light 33A to thereby form a protective member 22 on the upper surface 1A of the wafer 1 in the condition where the original curved shape of the wafer 1 in its natural condition is maintained. That is, the protective member 22 is formed from the liquid resin 21 and functions to protect the whole of the upper surface 1A of the wafer 1. The upper surface of the protective member 22 opposite to the wafer 1 as viewed in FIG. 7 is a flat surface 22A because the liquid resin 21 is pressed by the unit body 31 through the transparent sheet 5 as a flat pressure surface. After curing the liquid resin 21 to form the protective member 22, the suction force applied to the transparent sheet 5 is removed and the unit body 31 is next raised, so that the unit body 31 is separated from the transparent sheet 5 fixed to the protective member 22.

[Wafer Separating Step ST6]

Figure 8:
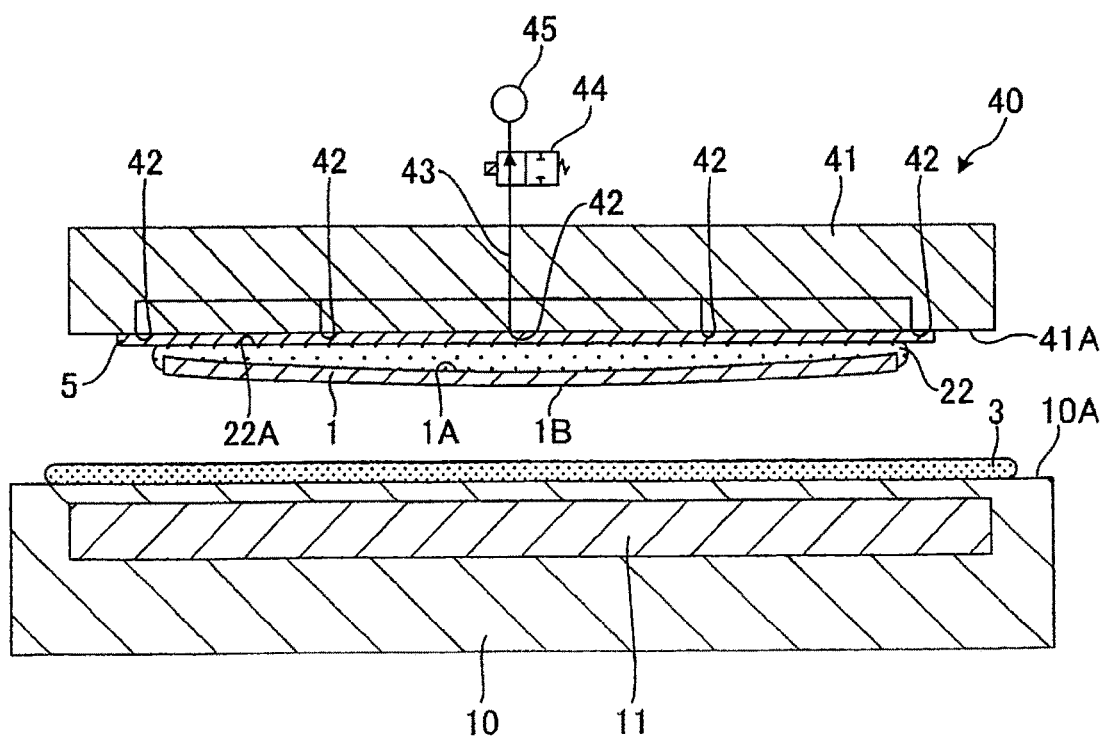
FIG. 8 is a schematic sectional view for illustrating a wafer separating step.

FIG. 8 is a schematic sectional view depicting the wafer separating step ST6. The wafer separating step ST6 may be performed by using a transfer unit 40 depicted in FIG. 8. The transfer unit 40 is so configured as to hold the unit of the wafer 1, the protective member 22, and the transparent sheet 5 under suction and transfer this unit. As depicted in FIG. 8, the transfer unit 40 includes a body member 41 vertically movable relative to the support base 10. A plurality of suction openings 42 are formed on the lower surface 41A of the body member 41. A suction passage 43 is formed inside the body member 41 and connected to the plural suction openings 42. The suction passage 43 is connected through an electromagnetic valve 44 to a vacuum source 45.

Accordingly, a suction force produced by the vacuum source 45 can be applied to the suction openings 42 of the lower surface 41A, so that the unit of the wafer 1, the protective member 22, and the transparent sheet 5 can be held on the lower surface 41A under suction. That is, the transparent sheet 5 of this unit is held on the lower surface 41A under suction in the condition where the lower surface 1B of the wafer 1 remains fixed to the ice layer 4. In this condition, the heat source portion 11 in the support base 10 is operated to heat the support base 10, thereby melting the ice layer 4 formed on the holding surface 10A to restore the water film 3. Accordingly, the wafer 1 can be separated from the water film 3 as depicted in FIG. 8. That is, after melting the ice layer 4, the body member 41 is raised to separate the unit of the wafer 1, the protective member 22, and the transparent sheet 5 from the water film 3 changed from the ice layer 4.

[Grinding Step ST7]

Figure 9:
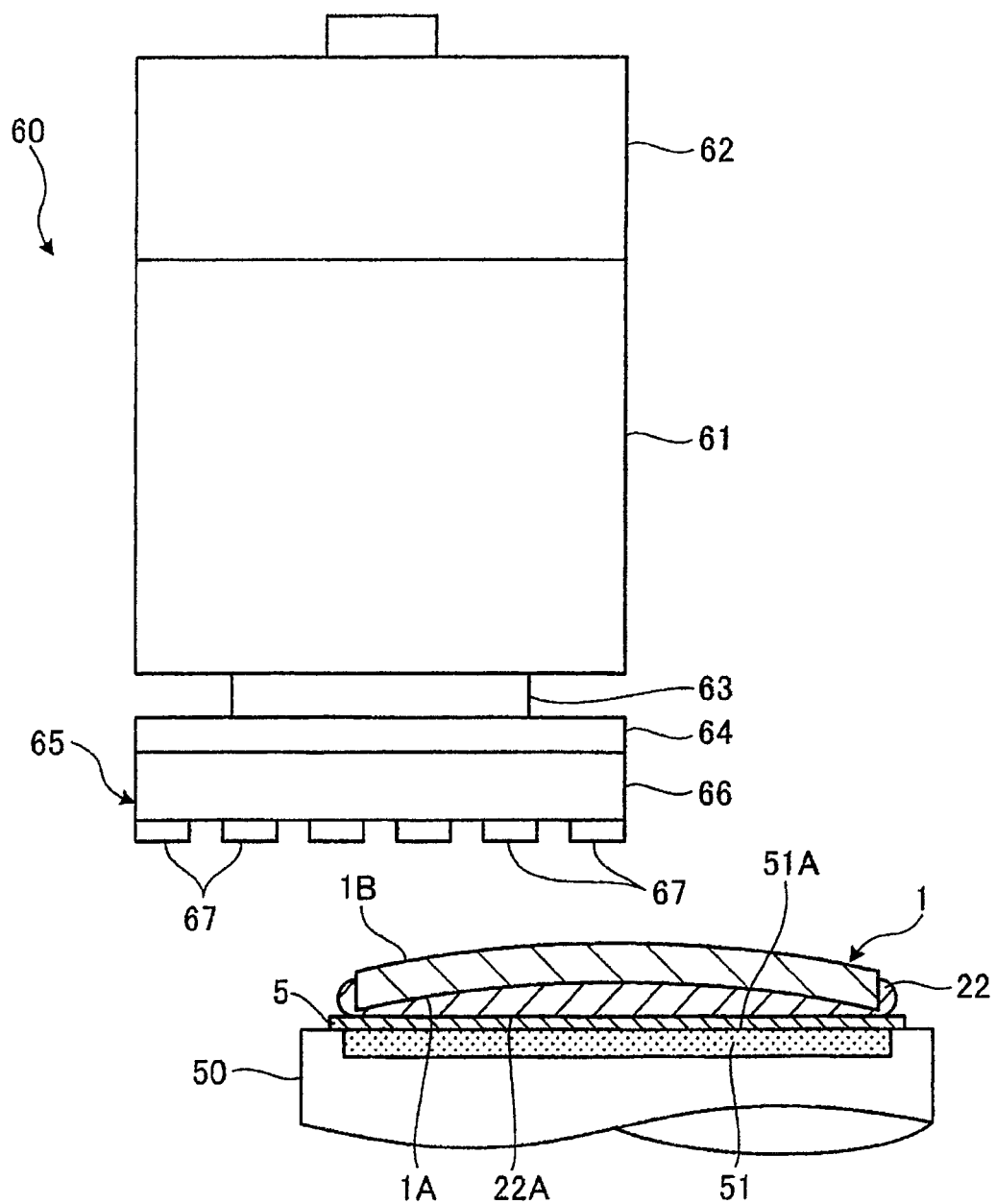
FIG. 9 is a schematic sectional view for illustrating a grinding step.

FIG. 9 is a schematic sectional view depicting the grinding step ST7. The grinding step ST7 may be performed by using a chuck table 50 and a grinding unit 60 depicted in FIG. 9. The chuck table 50 has a horizontal upper surface, which is provided with a vacuum chuck 51 for holding the wafer 1 under suction. That is, the vacuum chuck 51 is connected to a vacuum source (not depicted) for producing a suction force. The vacuum chuck 51 is a disk-shaped member formed of a porous material. The vacuum chuck 51 has an upper surface as a holding surface 51A for holding the wafer 1 under suction. The chuck table 50 is rotatable by rotational driving means (not depicted).

The grinding unit 60 is provided above the chuck table 50. The grinding unit 60 includes a housing 61, a motor 62 fixed to the upper end of the housing 61, and spindle 63 supported in the housing 61 and adapted to be rotated by the motor 62. A grinding wheel 65 is fixed through a flange 64 to the lower end of the spindle 63. The spindle 63 has a vertical axis as an axis of rotation. The grinding unit 60 is vertically movable by an elevating mechanism (not depicted). The grinding wheel 65 is composed of an annular frame 66 and a plurality of abrasive members 67 fixed to the lower surface of the annular frame 66 so as to be arranged annularly at given intervals.

In the grinding step ST7, the unit of the wafer 1, the protective member 22, and the transparent sheet 5 is held on the chuck table 50 in the condition where the flat surface 22A of the protective member 22 is held through the transparent sheet 5 under suction on the holding surface 51A of the vacuum chuck 51 of the chuck table 50 and that the lower surface (second surface) 1B of the wafer 1 is exposed upward. Thereafter, the chuck table 50 is rotated and the spindle 63 is also rotated. Thereafter, the grinding unit 60 is lowered until the abrasive members 67 of the grinding wheel 65 being rotated come into abutment against the wafer 1. Accordingly, the lower surface (second surface) 1B of the wafer 1 is ground to be flattened. The second surface 1B thus flattened becomes a reference surface. After flattening the second surface 1B of the wafer 1, the protective member 22 is removed from the upper surface (first surface) 1A of the wafer 1. Thereafter, the wafer 1 is held again on the chuck table 50 in the condition where the second surface 1B as the reference surface is held on the holding surface 51A under suction and that the first surface 1A of the wafer 1 is exposed upward. Thereafter, the first surface 1A of the wafer 1 is similarly ground by lowering the grinding unit 60 as rotating the chuck table 50 and the grinding wheel 65. Accordingly, the first surface 1A of the wafer 1 can be flattened. Thus, both the first surface 1A and the second surface 1B of the wafer 1 can be made flat and parallel to each other in the natural condition, and the thickness of the wafer 1 can therefore be made uniform.

As described above, the protective member forming method according to this preferred embodiment is a method for forming the protective member 22 by spreading the liquid resin 21 on the whole of the upper surface 1A of the wafer 1 and next curing the liquid resin 21. The protective member forming method according to this preferred embodiment includes the water film forming step ST1 of forming the water film 3 on the flat holding surface 10A of the support base 10, the water fixing step ST2 of placing the wafer 1 on the water film 3 formed on the holding surface 10A and next freezing the water film 3 in the condition where the wafer 1 floats on the upper surface of the water film 3 owing to the surface tension of the water film 3, thereby forming the ice layer 4 and fixing the wafer 1 on the ice layer 4, the liquid resin supplying step ST3 of supplying the liquid resin 21 curable by the application of ultraviolet light to the exposed upper surface 1A of the wafer 1, after performing the wafer fixing step ST2, in such an amount that when the liquid resin 21 is pressed on the upper surface 1A of the wafer 1, the liquid resin 21 is spread on the whole of the upper surface 1A, the liquid resin pressing step ST4 of opposing the transparent sheet 5 to the wafer 1 with the liquid resin 21 interposed therebetween, the transparent sheet 5 being parallel to the holding surface 10A, after performing the liquid resin supplying step ST3, and next pressing the liquid resin 21 to entirely spread the liquid resin 21 on the upper surface 1A of the wafer 1, the liquid resin curing step ST5 of applying ultraviolet light to the liquid resin 21 after performing the liquid resin pressing step ST4, thereby curing the liquid resin 21 to form the protective member 22 on the whole of the upper surface 1A of the wafer 1, and the wafer separating step ST6 of heating the ice layer 4 to thereby melt the ice layer 4 and next separate the wafer 1 from the ice layer 4. With this configuration, the water film 3 is frozen in the condition where the wafer 1 is placed on the water film 3, thereby fixing the wafer 1 on the ice layer 4 changed from the water film 3. Accordingly, the wafer 1 can be fixed as keeping the shape in the natural condition. Further, since the wafer 1 is fixed on the ice layer 4, the protective member 22 can be easily formed on the upper surface (first surface) 1A of the wafer 1.

Further, according to this preferred embodiment, the holding surface 10A of the support base 10 is coated with a water-repellent material. Accordingly, the water film 3 formed on the holding surface 10A can be made circular, so that the wafer 1 can be easily placed on the water film 3.

The present invention is not limited to the details of the above described preferred embodiment. The scope of the invention is defined by the appended claims and all changes and modifications as fall within the equivalence of the scope of the claims are therefore to be embraced by the invention.

What is claimed is:
1. A protective member forming method comprising:
    a water film forming step of forming a water film on a flat holding surface of a support base;
    a wafer fixing step of placing a wafer having a first surface with a length and a second surface, on the water film formed on the holding surface where the first surface of the wafer is exposed and the second surface of the wafer is in contact with the upper surface of the water film, and freezing the water film in a condition where the wafer floats on an upper surface of the water film due to surface tension of the water film, thereby forming an ice layer and fixing the wafer on the ice layer;
    a liquid resin supplying step of supplying a liquid resin curable by an external stimulus to the first surface of the wafer, after performing the wafer fixing step, in such an amount that when the liquid resin is pressed on the first surface of the wafer, the liquid resin is spread on the entire length of the first surface;
    a liquid resin pressing step of opposing a flat pressure surface to the wafer with the liquid resin interposed therebetween, the flat pressure surface being parallel to the holding surface, after performing the liquid resin supplying step, and next pressing the liquid resin to entirely spread the liquid resin on the entire length of the first surface of the wafer;
    a liquid resin curing step of applying the external stimulus to the liquid resin after performing the liquid resin pressing step, thereby curing the liquid resin to form a protective member on the entire length of the first surface of the wafer; and
    a wafer separating step of heating the ice layer to thereby melt the ice layer and next separate the wafer from the ice layer.
2. The protective member forming method according to claim 1, wherein the holding surface of the support base is coated with a water-repellent material.
3. The protective member forming method according to claim 1, further comprising placing a cover member on the holding surface of the support base to define an inside space for enclosing the wafer and the water film.
4. The protective member forming method according to claim 1, further comprising raising and lowering a resin pressing and curing unit relative to the support base, wherein the resin pressing unit includes a body with a lower surface, a transparent plate on the lower surface and a plurality of ultraviolet lights inside the body.
5. The protective member forming method according to claim 4, further comprising placing a transparent sheet on the lower surface of the body of the resin pressing and curing unit.
6. The protective member forming method according to claim 1, further comprising a step of grinding the cured liquid resin on the first surface of the wafer and the second surface of the wafer.

* * * * *